United States Patent
Tang et al.

(10) Patent No.: US 9,800,235 B2
(45) Date of Patent: Oct. 24, 2017

(54) ADAPTIVE EDGE-RATE BOOSTING DRIVER WITH PROGRAMMABLE STRENGTH FOR SIGNAL CONDITIONING

(71) Applicant: TEXAS INSTRUMENTS INCORPORATED, Dallas, TX (US)

(72) Inventors: Yonghui Tang, Plano, TX (US); M D Anwar Sadat, Richardson, TX (US); Hao Liu, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/725,001

(22) Filed: May 29, 2015

(65) Prior Publication Data
US 2015/0358011 A1 Dec. 10, 2015

Related U.S. Application Data

(60) Provisional application No. 62/007,681, filed on Jun. 4, 2014.

(51) Int. Cl.
*H03K 5/1534* (2006.01)
*H03K 5/26* (2006.01)
*H03K 19/003* (2006.01)

(52) U.S. Cl.
CPC ............ *H03K 5/1534* (2013.01); *H03K 5/26* (2013.01); *H03K 19/00315* (2013.01)

(58) Field of Classification Search
CPC ................................................... H03K 5/1534
See application file for complete search history.

(56) References Cited

U.S. PATENT DOCUMENTS

| | | | | |
|---|---|---|---|---|
| 2010/0201443 A1* | 8/2010 | Kaya | ...................... | H03F 3/217 330/251 |
| 2013/0033319 A1* | 2/2013 | Chen | ...................... | H03F 1/32 330/251 |

* cited by examiner

*Primary Examiner* — Daniel Puentes
(74) *Attorney, Agent, or Firm* — Gregory J. Albin; Charles A. Brill; Frank D. Cimino (57) ABSTRACT

A signal conditioner that includes a transition-detection module and a current-injection module. The transition-detection module is configured to receive a pair of differential signals from a data line and generate one or more comparator output signals and a transition-indication signal to indicate whether a transition has been detected on the differential signals. The current-injection module is configured to receive the comparator output signals and transition-indication signal from the transition-detection module, and generate appropriate currents for injection into the data line to boost edge rates of the differential signals when the transition-detection module detects a transition of the differential signals or remain high impedance when no transition occurs on the differential signals.

20 Claims, 4 Drawing Sheets

ADAPTIVE EDGE-RATE BOOSTING DRIVER WITH PROGRAMMABLE STRENGTH FOR SIGNAL CONDITIONING

CROSS-REFERENCE TO RELATED APPLICATIONS

The present application claims priority to U.S. Provisional Patent Application No. 62/007,681, filed on Jun. 4, 2014, titled "ADAPTIVE EDGE-RATE BOOSTING DRIVER WITH PROGRAMMABLE STRENGTH FOR SIGNAL CONDITIONING APPLICATIONS," which is hereby incorporated herein by reference in its entirety.

BACKGROUND

Data transmission systems such as Universal Serial Bus (USB) 2.0 may benefit from signal conditioning to strengthen deteriorated signals due to transmission losses. Generally, a signal conditioner may comprise a receiver, an equalizer, and a transmitter. Such a signal conditioner often is uni-directional and is connected in series in data lines. That is, signals can flow in only one direction through the equalizer. For half-duplex or full-duplex data transmission, two signal conditioners are required, one for each of the two transmission channels that have opposite directions of data flow. This configuration often results in high circuit complexity and low power efficiency. For USB 2.0 system, this configuration will not be functional since the system configuration protocol cannot be understood and the communication between the host and device will be interrupted.

SUMMARY

The problems noted above are solved in large part by direction-agnostic signal conditioning systems and methods. In some embodiments, a signal conditioner may include a transition-detection module and a current-injection module. The transition-detection module is configured to receive a pair of differential signals from a data line and generate one or more comparator output signals and a transition-indication signal to indicate whether a transition has been detected on the differential signals. The current-injection module is configured to receive the comparator output signals and transition-indication signal from the transition-detection module, and generate currents for injection into the data line when the transition-detection module detects a transition of the differential signals or remain high impedance when no transition occurs on the differential signals.

Another illustrative embodiment is a method that includes receiving a pair of differential signals from a data line, by a transition-detection module. The method also includes generating a comparator output signal and a transition-indication signal to indicate whether a transition has been detected on the differential signals, by the transition-detection module. The method also includes generating a first pair of gating signals based on the comparator output signal from the transition-detection module for a first push-pull driver. The method also includes generating a second pair of gating signals based on the comparator output signal from the transition-detection module for a second push-pull driver. The method also includes generating a third gating signal based on the transition-indication signal from the transition-detection module for a first and a second blocking switches. The first blocking switch may be coupled between output of the first push-pull driver and one differential signal, and the second blocking switch may be coupled between output of the second push-pull driver and the other differential signal. The method also includes generating currents for injection into the data line to boost edge rates of the differential signals, through the first and second push-pull drivers and the first and second blocking switches, when the transition of the differential signals is detected.

Yes another illustrative embodiment is a system that include a first and a second differential comparators, an AND gate, a first and a second push-pull drivers, and a first and a second blocking switches. The first and second differential comparators are coupled in parallel with opposite input polarities and configured to receive a pair of differential signals from a data line and generate a first and a second comparator output signals, respectively. The AND gate is configured to receive the first and second comparator output signals and generate a transition-indication signal. The first and second comparator output signals and the transition-indication signal indicate whether a transition has been detected on the differential signals. The first blocking switch is coupled between output of the first push-pull driver and one differential signal. The second blocking switch is coupled between output of the second push-pull driver and the other differential signal. The first and second comparator output signals are regulated to generate a first pair of gating signals for the first push-pull driver, by a first AC-coupled pull-up RC network with a first inverting buffer and a first AC-coupled pull-down RC network with a first buffer. The first and second comparator output signals are regulated to generate a second pair of gating signals for the second push-pull driver, by a second AC-coupled pull-up RC network with a second inverting buffer and a second AC-coupled pull-down RC network with a second buffer. A third gating signal is generated for the first and second blocking switches, based on the transition-indication signal. The first and second push-pull drivers generate currents for injection into the data line, through the first and second blocking switches respectively, to boost edge rates of the differential signals when the transition of the differential signals is detected. The first and second blocking switches remain off to maintain high impedance when no transition occurs on the differential signals.

NOTATION AND NOMENCLATURE

Certain terms are used through the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Data transmission is the physical transfer of data over a communication channel. For example, USB (e.g., USB 2.0) may transfer a pair of differential signals through data lines. A signal conditioner may be employed to strengthen deteriorated signals along the transmission path due to transmission losses. Generally, signal conditioners have been employed that include a receiver, an equalizer, and a transmitter. The equalizer provides the primary signal conditioning functionality, and the receiver and transmitter provide interfaces with the data lines. Such signal conditioners typically are connected in series in data lines. That is, the transmitted signal from an input/output (I/O) port is received by the signal conditioner, conditioned, and then retransmitted to the corresponding other I/O port. Signals can flow in only one direction from the receiver to the transmitter through the equalizer. The signal conditioner is therefore uni-directional. For half-duplex or full-duplex data transmission where bidirectional data transfer is required, two signal conditioners will be employed, one for each of the two transmission channels. This configuration often results in high circuit complexity and low power efficiency. For USB 2.0 system, this configuration will not be functional since the system configuration protocol cannot be understood and the communication between the host and device will be interrupted.

To mitigate these limitations, in an embodiment a direction-agnostic signal conditioner may be employed which may tap into data lines in a parallel connection, rather than breaking up the data lines and being connected in series between the I/O ports. The disclosed signal conditioner may include a transition-detection module and a current-injection module. The transition-detection module is configured to receive differential signals from the data lines and generate one or more comparator output signals and a transition-indication signal. When a transition of the differential signals on the data lines occurs, i.e., the two signals change from one logic state to another state, the comparator output signals and the transition-indication signal may transition from one logic state to another state as well. Thus, the state changes of the comparator output signals and the transition-indication signal may serve as a detection of differential signal transitions.

The signal conditioner's current-injection module is configured to receive the comparator output signals and the transition-indication signal from the transition-detection module and generate appropriate injection currents. The injection currents are injected into the differential data lines to strengthen the differential signals. In one example, if a transition of the differential signals is detected, the current-injection module generates currents for injection into the data lines to boost edge rates of the differential signals. A positive current may be injected into the differential signal with a rising edge and a negative current may be injected into the other differential signal with a falling edge. If the differential signals have no transition, e.g., the differential signals are in steady states, the current-injection module may remain high impedance to maintain signal DC level.

This signal conditioner described herein is direction-agnostic which means it conditions the signals on the data lines regardless of which direction the data signals are flowing. Signals may be transferred in both directions over the data lines while the signal conditioner is being employed and thus two signal conditions (one for each data signal direction) are not necessary. For half-duplex or full-duplex data transmission, only one signal conditioner may be needed.

Figure 1:
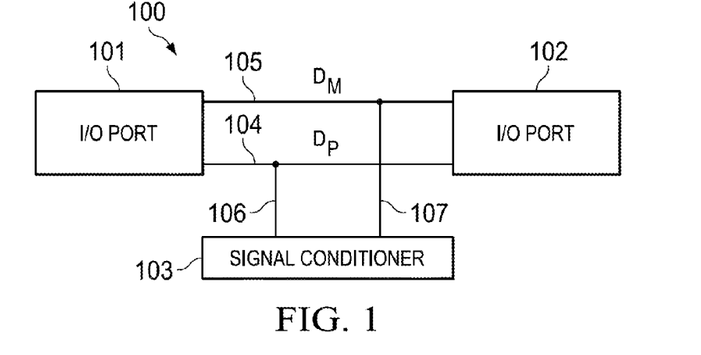
FIG. 1 shows a block diagram of an illustrative data transmission system in accordance with various embodiments.

FIG. 1 shows a block diagram of an illustrative data transmission system 100 in accordance with various embodiments. A pair of differential signals $D_P$ and $D_M$ is transferred over data lines 104 and 105 between two I/O ports 101 and 102. Each I/O port 101 and 102 may include a receiver, a transmitter, or a transceiver (both transmitter and receiver) to send or receive data signals to the corresponding other I/O port. The I/O ports may be coupled together via, for example, a USB cable and may be capable of simplex or duplex data transmissions. An example of such a data transmission system is a peripheral device coupled to the USB port of a computer via a USB cable.

A signal conditioner 103 taps into the data lines 104 and 105 in a parallel connection and receives the differential signals $D_P$ and $D_M$ via wires 106 and 107. The signal conditioner 103 may detect transitions of the differential signals $D_P$ and $D_M$ and inject currents to boost the signal edge rates during each such detected transition. For example, if the differential signal $D_P$ changes from HIGH to LOW and the other differential signal $D_M$ changes from LOW to HIGH, a negative current is injected into the data line 104 via the wire 106 and a positive current is injected into the data line 105 via the wire 107, by the signal conditioner 103. If the differential signal $D_P$ changes from LOW to HIGH and the other differential signal $D_M$ changes from HIGH to LOW, a positive current is injected into the data line 104 via the wire 106 and a negative current is injected into the data line 105 via the wire 107, by the signal conditioner 103

Figure 2:
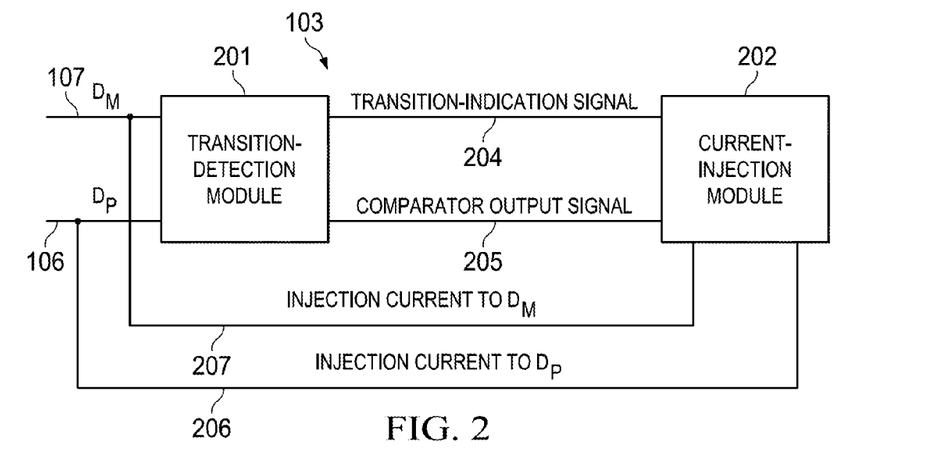
FIG. 2 shows a block diagram of an illustrative signal conditioner in accordance with various embodiments.

FIG. 2 shows a block diagram of an illustrative signal conditioner 103 in accordance with various embodiments. The signal conditioner 103 in this example may include a transition-detection module 201 and a current-injection module 202. The transition-detection module 201 receives the differential signals $D_P$ and $D_M$ via the wires 106 and 107 and generates a transition-indication signal 204 and one or more comparator output signal 205, to indicate a transition has been detected on the differential signals $D_P$ and $D_M$. The current-injection module 202 is configured to receive the transition-indication signal 204 and the comparator output signal 205 from the transition-detection module 201, and determines whether positive or negative currents are to be injected into each differential signal based on the detection of transitions by the transition-detection module 202. The current-injection module 202 generates appropriate injection currents 206 and 207 for each detected transition on the differential signals $D_P$ and $D_M$, or remains high impedance when $D_P$ and $D_M$ have no transitions.

Figure 3:
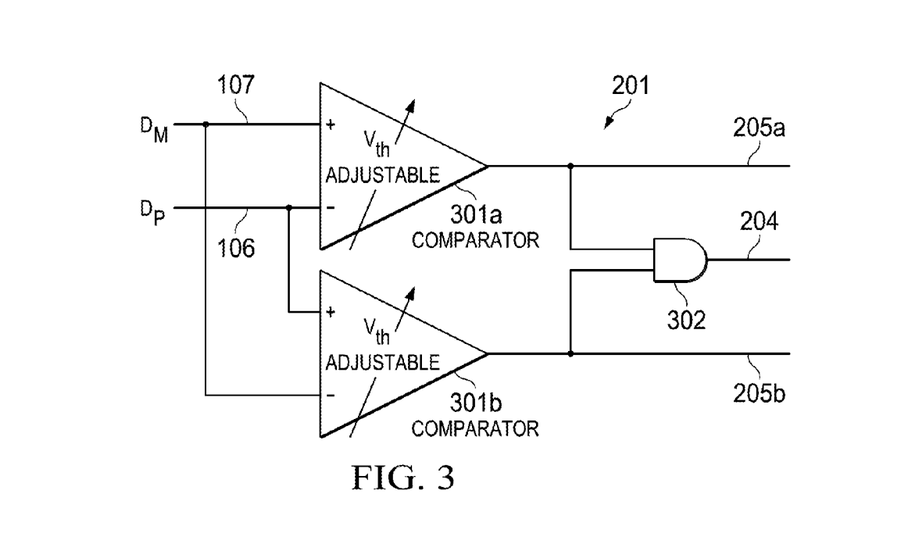
FIG. 3 shows a circuit diagram of an illustrative transition-detection module in accordance with various embodiments.

FIG. 3 shows a circuit diagram of an illustrative transition-detection module 201 in accordance with various embodiments. The transition-detection module 201 may include two differential comparators 301a and 301b and an AND gate 302. The two differential comparators 301a and 301b are coupled in parallel with opposite input polarities. As such, the differential signal $D_M$ is provided to the positive (+) input of comparator 301a and to the negative (−) input of comparator 301b. Similarly, the other differential signal $D_P$ is provided to the negative (−) input of comparator 301a and to the positive (+) input of comparator 301b. The differential comparators 301a and 301b receive the differential signals $D_P$ and $D_M$ and generate comparator output signals 205a and 205b, respectively. The AND gate 302 is configured to receive the comparator output signals 205a and 205b and generate a transition-indication signal 204 to indicate whether a transition has been detected on the differential signals $D_P$ and $D_M$.

The differential comparators 301a and 301b may each be a differential receiver with a relatively low propagation delay, which compares the difference between its positive input and its negative input to a non-zero threshold voltage ($V_{th}$). When the difference between the positive input and the negative input is equal to or higher than $V_{th}$, the differential comparators 301a and 301b generate logic high output signals 205a and 205b, respectively. Otherwise, the differential comparators 301a and 301b generate logic low output signals 205a and 205b, respectively. For example, If $(D_M-D_P) \geq V_{th}$, 205a is HIGH; Otherwise, 205a is LOW; and If $(D_P-D_M) \geq V_{th}$, 205b is HIGH; Otherwise, 205b is LOW.

Early detection of a transition on the differential signals can be obtained because the differential comparators 301a and 301b have the non-zero threshold voltage ($V_{th}$). Further, the threshold $V_{th}$ may be adjustable to allow the differential comparators 301a and 301b to interface with a variety of data transmission protocols with different signal voltages. The transition-indication signal 204 depends on the comparator output signals 205a and 205b. The transition-indication signal 204 is HIGH when both of the comparator output signals 205a and 205b are HIGH. The transition-indication signal 204 is LOW when one of the comparator output signals 205 and 205b is LOW.

The transition-indication signal 204 and comparator output signals 205a and 205b change states in correspondence to transitions of the differential signals $D_P$ and $D_M$. Thus, they may serve as a detection of differential signal transitions. For example, at one instant, the differential signals $D_P$ and $D_M$ are in steady states where $D_P$ is HIGH and $D_M$ is LOW. The difference between the positive input and the negative input of 301a, $(D_M-D_P)$, is at its minimum and thus the comparator output signal 205a is LOW. The difference between the positive input and the negative input of 301b, $(D_P-D_M)$, is at its maximum and thus the comparator output signal 205b is HIGH. The output of the AND gate 302, i.e., the transition-indication signal 204, is therefore LOW. If a transition occurs where $D_P$ transitions from HIGH to LOW and $D_M$ transitions from LOW to HIGH, the comparator output signal 205a will change from LOW to HIGH and the comparator output signal 205b will change from HIGH to LOW. Because the differential comparators 301a and 301b have the non-zero threshold voltage $V_{th}$, the comparator output signals 205a and 205b change states either earlier (with a rising edge) or later (with a falling edge) than the zero-crossing of the differential signals $D_P$ and $D_M$. For example, the rising edge of 205a will occur near beginning of the transition once $(D_P-D_M)$ becomes less than $V_{th}$. The falling edge of 205b will occur near end of the transition when $(D_M-D_P)$ becomes larger than $V_{th}$. Consequently, the transition-indication signal 204 will change from LOW to HIGH with the rising edge of 205a near beginning of the transition, and will change from HIGH back to LOW with the falling edge of 205b near end of the transition. In other words, the transition-indication signal 204 remains HIGH during this transition of the differential signals.

Similarly, if at another instant, the differential signals $D_P$ and $D_M$ are at steady states where $D_P$ is LOW and $D_M$ is HIGH, the comparator output signal 205a is HIGH, the comparator output signal 205b is LOW, and the transition-indication signal 204 is LOW. If a transition occurs where $D_P$ transitions from LOW to HIGH and $D_M$ transitions from HIGH to LOW, the comparator output signal 205a will change from HIGH to LOW and the comparator output signal 205b will change from LOW to HIGH. Further, the rising edge of 205b will occur near beginning of the transition and the falling edge of 205a will occur near end of the transition. Consequently, the transition-indication signal 204 will change from LOW to HIGH with the rising edge of 205b near beginning of the transition, and will change from HIGH back to LOW with the falling edge of 205a near end of the transition. Again, the transition-indication signal 204 remains HIGH during the transition of the differential signals $D_P$ and $D_M$. In summary, the transition-indication signal 204 is HIGH during transitions of the differential signals $D_P$ and $D_M$, and remains LOW otherwise.

Figure 4:
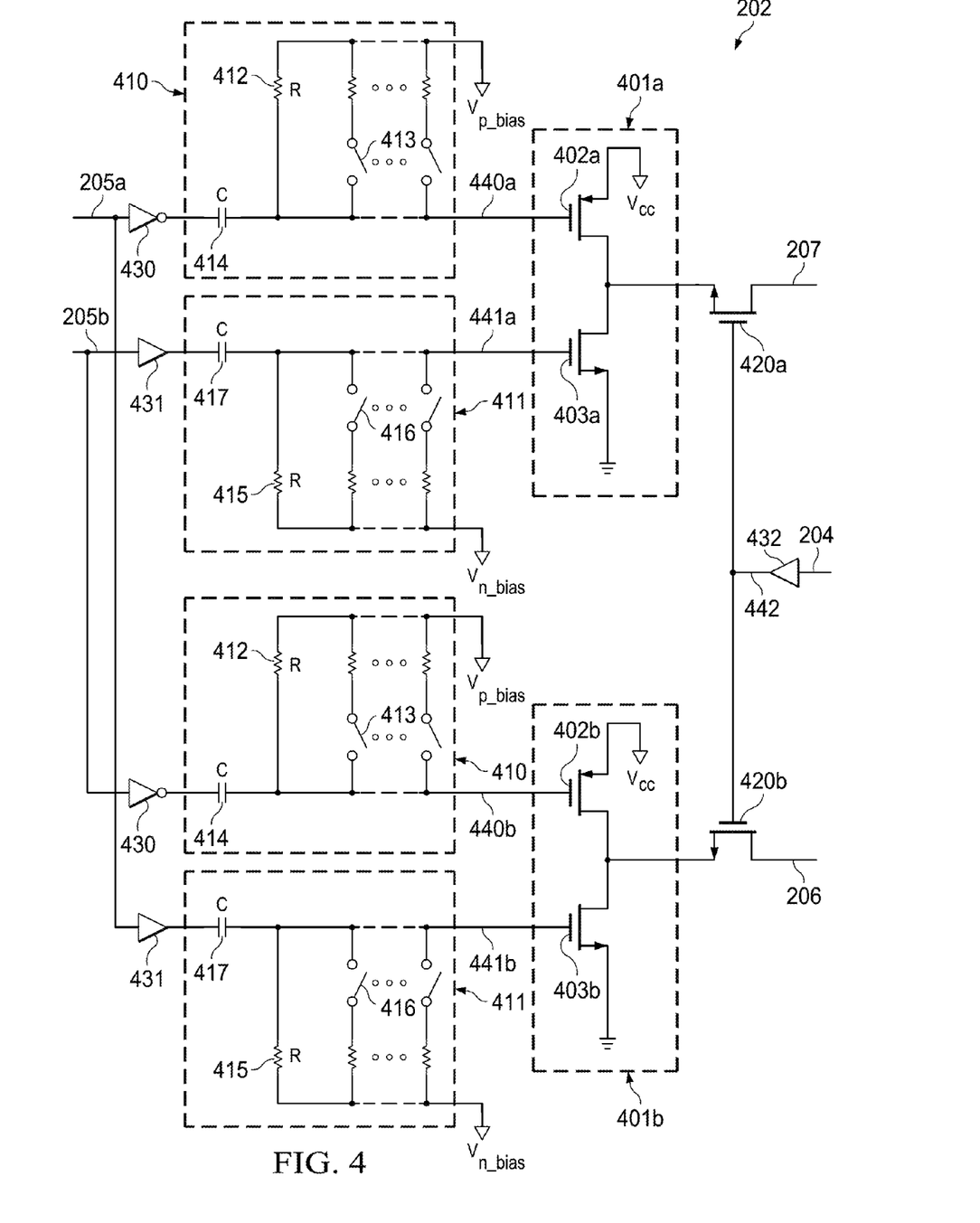
FIG. 4 shows a circuit diagram of an illustrative current-injection module in accordance with various embodiments.

FIG. 4 shows a circuit diagram of an illustrative current-injection module 202 in accordance with various embodiments. The current-injection module 202 may include two push-pull drivers 401a and 401b, which may be further coupled to output blocking switches 420a and 420b, respectively. Each of the push-pull drivers 401a and 401b is driven by a pair of gating signals. Push-pull driver 401a is driven by gating signal pair 440a and 441a, while push-pull driver 401 is driven by gating signal pair 440b and 441 b. The two blocking switches 420a and 420b are driven by a gating signal 442. The two push-pull drivers 401a and 401b, together with associated blocking switches 420a and 420b, work similarly. To facilitate understanding, the operating principle of the push-pull driver 401a and its blocking switch 420a is first described below.

The push-pull driver 401a may include a p-channel MOSFET (pMOS) 402a coupled in series with an n-channel MOSFET (nMOS) 403a between a supply voltage ($V_{cc}$) and ground. The pMOS 402a turns on when the gating signal 440a is equal to or lower than its threshold voltage ($V_{p\_th}$) and turns off when the gating signal 440a is higher than $V_{p\_th}$. The gating signal 440a is generated based on regulating the comparator output signal 205a. The comparator output signal 205a is regulated by a first inverting buffer 430 and a first AC-coupled pull-up resistor-capacitor (RC) network 410. The inverting buffer 430 may be employed to match polarity of the comparator output signal 205a with required polarity of the gating signal 440a. The AC-coupled pull-up RC network 410 may include a capacitor 414, a plurality of resistors 412, and a plurality of switches 413.

The capacitor 414 is coupled in series with the gate of the pMOS 402a. The resistors 412, in series with and selected by the switches 413, are coupled in parallel between a voltage source ($V_{P\_bias}$) and the gate of the pMOS 402a.

Depending on the status of the comparator output signal 205a, the pMOS 402a may operate in different modes. For example, if the comparator output signal 205a is in a steady state (i.e., at a constant DC voltage), the AC-coupled pull-up RC network 410 blocks the comparator output signal 205a via the capacitor 414 regardless of whether 205a is HIGH or LOW. Instead, the AC-coupled pull-up RC network 410 clamps the gating signal 440a at a stable voltage higher than $V_{p\_th}$ through the resistors 412 and the voltage source $V_{p\_bias}$. Thus, the pMOS 402a remains off. However, upon occurrence of a falling edge of the comparator output signal 205a, the transient voltage of 205a will cause a transient voltage on the gating signal 440a to the gate of pMOS 402a. The gating signal 440a will transition with a voltage spike, from the clamping voltage first to a higher voltage and then back to the clamping voltage. Throughout the transient response to the falling edge of signal 205a, the gating signal 440a will remain higher than $V_{p\_th}$ and therefore the pMOS 402a still remains off. Finally, if there is a rising edge of the comparator output signal 205a, the transient voltage of 205a will cause the gating signal 440a to transition with a voltage sag, from the clamping voltage first to a voltage lower than $V_{p\_th}$ and then back to the clamping voltage. Correspondingly, the pMOS 402a will first turn on and then turn off. In short, the pMOS 402a turns on when there is a rising edge of the comparator output signal 205a and remains off otherwise.

The first AC-coupled pull-up RC network 410 provides an RC time constant. The time constant of the first AC-coupled pull-up RC network 410 may be configured by changing its resistance through control of the switches 413. By controlling the time constant, the AC-coupled pull-up RC network 410 may control the length of time and magnitude of the transient voltage of the gating signal 440a and thus the duration and strength of the pMOS 402a to remain ON.

The nMOS 403a operates in an opposite way, meaning that the nMOS 403a turns on when the gating signal 441a is equal to or higher than its threshold voltage ($V_{n\_th}$) and turns off when the gating signal 441a is lower than $V_{n\_th}$. The gating signal 441a is generated based on regulating the comparator output signal 205b. The comparator output signal 205b is regulated by a first buffer 431 and a first AC-coupled pull-down RC network 411. The buffer 431 may be employed to compensate for delays and synchronize the gating signal 441a with the other gating signals. The AC-coupled pull-down RC network 411 may include a capacitor 417, a plurality of resistors 415, and a plurality of switches 416. The capacitor 417 is coupled in series with the gate of the nMOS 403a. The resistors 415, in series with and selected by the switches 416, are coupled in parallel between a voltage source ($V_{n\_bias}$) and the gate of the nMOS 403a.

Depending on the status of the comparator output signal 205b, the nMOS 403a may operate in different modes. For example, if the comparator output signal 205b is in a steady state (i.e., at a constant DC voltage), the AC-coupled pull-down RC network 411 blocks the comparator output signal 205b via the capacitor 417 regardless of whether 205b is HIGH or LOW. Instead, the AC-coupled pull-down RC network 411 clamps the gating signal 441a at a stable voltage lower than $V_{n\_th}$ through the resistors 415 and the voltage source $V_{n\_bias}$. Thus, the nMOS 403a remains off. However, upon occurrence of a falling edge of the comparator output signal 205b, the transient voltage of 205b will cause a transient voltage on the gating signal 441a to the gate of nMOS 403a. The gating signal 441a will transition with a voltage sag, from the clamping voltage first to a lower voltage and then back to the clamping voltage. Throughout the transient response to the falling edge of signal 205b, the gating signal 441a will remain lower than $V_{n\_th}$ and therefore nMOS 402a still remains off. Finally, if there is a rising edge of the comparator output signal 205b, the transient voltage of 205b will cause the gating signal 441a to transition with a voltage spike, from the clamping voltage first to a voltage higher than $V_{n\_th}$ and then back to the clamping voltage. Correspondingly, the nMOS 403a will first turn on and then turn off. In short, the nMOS 403a turns on when there is a rising edge of the comparator output signal 205b and remains off otherwise.

The first AC-coupled pull-down RC network 441 provides an RC time constant. The time constant of the first AC-coupled pull-down RC network 411 may be configured by changing its resistance through control of switches 416. By controlling the time constant, the AC-coupled pull-down RC network 411 may control the length of the time and magnitude of the transient voltage of the gating signal 441a and thus the duration and strength of the nMOS 403a to remain ON. The switches can be set (on or off) during a configuration process by control logic (not shown).

The blocking switch 420a is coupled to the output of the push-pull driver 401a and generates an output 207 that is fed back into the differential signal $D_M$. The blocking switch 420a may be implemented by an nMOS driven by the gating signal 442. The gating signal 442 is generated based on the transient-indication signal 204. A third buffer 432 may be employed to compensate for delays and synchronize the gating signal 442 with the other gating signals. The blocking switch 420a turns on when the gating signal 442 is equal to or higher than its threshold voltage, and remains off (i.e., in high impedance) otherwise.

As mentioned above, the push-pull driver 401b with the blocking switches 420b works similarly to the push-pull driver 401a with the blocking switches 420a. The push-pull driver 401b may be configured similarly as the push-pull driver 401a, including a pMOS 402b coupled in series with an nMOS 403b between the supply voltage ($V_{cc}$) and ground. The pMOS 402b and nMOS 403b are driven by the gating signals 440b and 441 b, respectively.

The gating signal 440b to the pMOS 402b is generated based on regulating the comparator output signal 205b. The comparator output signal 205b is regulated by a second inverting buffer 430 and a second AC-coupled pull-up RC network 410. The second inverting buffer 430 may be employed to match polarity of the comparator output signal 205b with required polarity of the gating signal 440b. The second AC-coupled pull-up RC network 410 may include a capacitor 414, a plurality of resistors 412, and a plurality of switches 413. The capacitor 414 is coupled in series with the gate of the pMOS 402b. The resistors 412, in series with and selected by the switches 413, are coupled in parallel between the voltage source ($V_{p\_bias}$) and the gate of the pMOS 402b. In reference to the operating principle of the push-pull driver 401a and its blocking switch 420a, the pMOS 402b may operate in different modes depending on the status of the signal 205b. For example, if the comparator output signal 205b is in a steady state (i.e., at a constant DC voltage), the pMOS 402b remains off because its gating signal 440b is clamped at a stable voltage higher than its threshold voltage ($V_{p\_th}$) through the resistors 412 and the voltage source ($V_{p\_bias}$). Upon occurrence of a falling edge of the comparator output signal 205b, the transient voltage of 205b will cause a transient voltage spike on the gating signal 440b. The pMOS 402b still remains off since the gating signal 440b remains higher than $V_{p\_th}$ throughout the transient. Finally, if there is a rising edge of the comparator output signal 205b, the transient voltage of 205b will cause the gating signal 440b to transition with a voltage sag from the clamping voltage first to a voltage lower than $V_{p\_th}$ and then back to the clamping voltage. Thus, the pMOS 402b will first turn on and then turn off. In short, the pMOS 402b turns on when there is a rising edge of the comparator output signal 205b and remains off otherwise.

The gating signal 441b to the nMOS 403b is generated based on regulating the comparator output signal 205a. The comparator output signal 205a is regulated by a second buffer 431 and a second AC-coupled pull-down RC network 411. The second buffer 431 may be employed to compensate for delays and synchronize the gating signal 441b with the other gating signals. The second AC-coupled pull-down RC network 411 may include a capacitor 417, a plurality of resistors 415, and a plurality of switches 416. The capacitor 417 is coupled in series with the gate of the nMOS 403b. The resistors 415, in series with and selected by the switches 416, are coupled in parallel between the voltage source ($V_{n\_bias}$) and the gate of the nMOS 403a. Depending on the status of the comparator output signal 205a, the nMOS 403b may operate in different modes. For example, if the comparator output signal 205a is in a steady state (i.e., at a constant DC voltage), the nMOS 403b remains off because its gating signal 441b is clamped at a stable voltage lower than its threshold voltage ($V_{n\_th}$) through the resistors 415 and the voltage source ($V_{n\_bias}$). Upon occurrence of a falling edge of the comparator output signal 205a, the transient voltage of 205a will cause a transient voltage sag on the gating signal 441b. The nMOS 403b still remains off since the gating signal 441b remains lower than $V_{n\_th}$ throughout the transient. Finally, if there is a rising edge of the comparator output signal 205a, the transient voltage of 205a will cause the gating signal 441b to transition with a voltage spike, from the clamping voltage first to a voltage higher than $V_{n\_th}$ and then back to the clamping voltage. Thus, the nMOS 403b will first turn on and then turn off. In short, the nMOS 403b turns on when there is a rising edge of the comparator output signal 205a and remains off otherwise.

The time constant of the second AC-coupled pull-up RC network 410 may be configured by changing its resistance through control of the switches 413. By controlling the time constant, the second AC-coupled pull-up RC network 410 may control the length of time and magnitude of the transient voltage of the gating signal 440b and thus the duration and strength of the pMOS 402b to remain ON. The time constant of the second AC-coupled pull-down RC network 411 may be configured by changing its resistance through control of switches 416. By controlling the time constant, the second AC-coupled pull-down RC network 411 may control the length of the time and magnitude of the transient voltage of the gating signal 441b and thus the duration and strength of the nMOS 403b to remain ON.

The blocking switch 420b is coupled to the output of the push-pull driver 401b and generates an output 206 that is fed back into the differential signal $D_P$. The blocking switch 420b may be implemented by an nMOS driven by the gating signal 442. The blocking switch 420b turns on when the gating signal 442 is equal to or higher than its threshold voltage, and remains off (i.e., in high impedance) otherwise.

Figure 5:
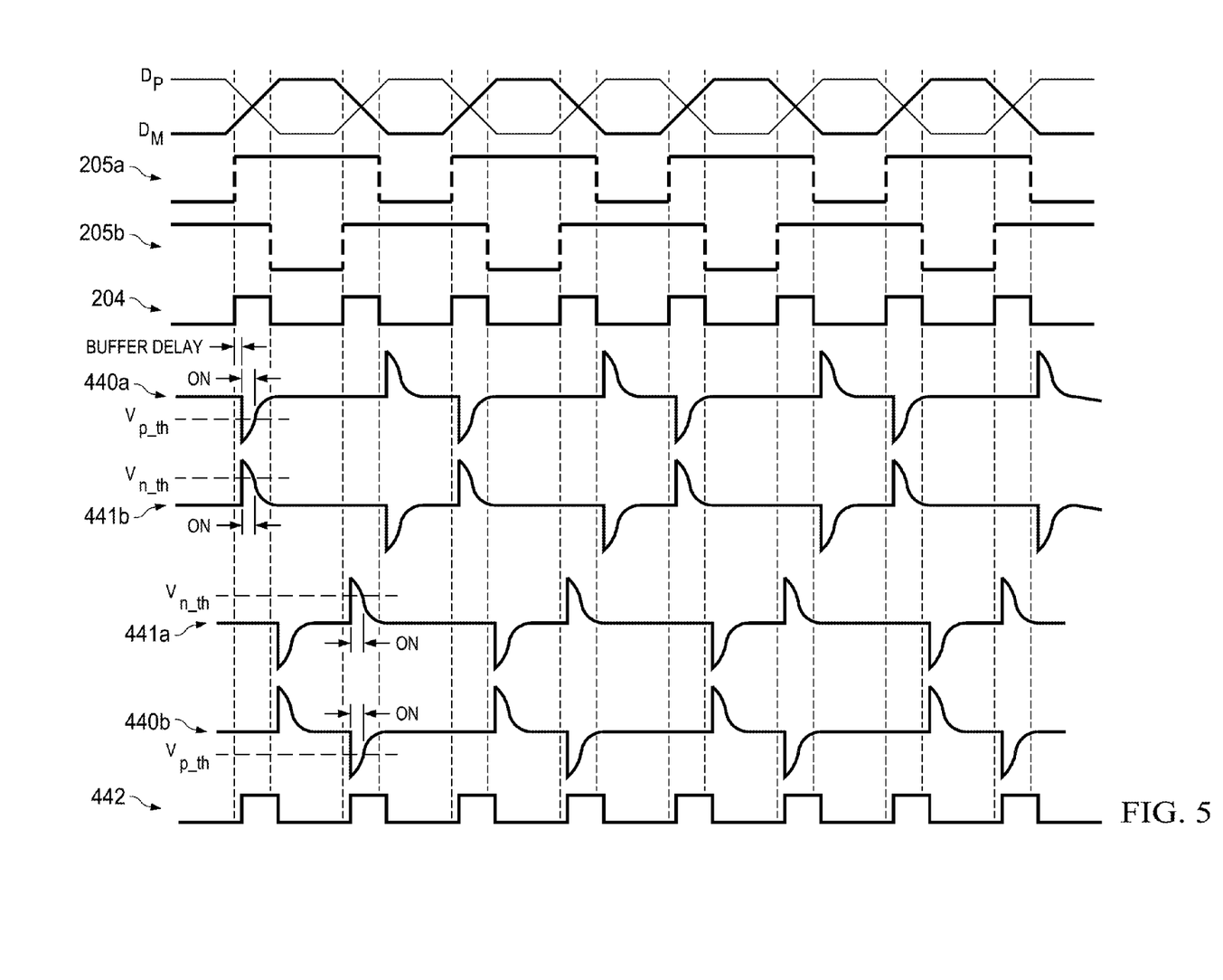
FIG. 5 shows exemplary signal waveforms of an illustrative signal conditioner in accordance with various embodiments.

Referring now to FIG. 5, the waveforms of the various signals described above will be further explained. As shown herein, at the beginning, the differential signals $D_P$ and $D_M$ are in steady states where $D_P$ is HIGH and $D_M$ is LOW. The comparator output signal 205a from differential comparator 301a is LOW, the comparator output signal 205b from differential comparator 301b is HIGH, and the transition-indication signal 204 from the AND gate 302 is LOW. The gating signal 442, which is based on the signal 204 with a small delay from the buffer 432, is LOW as well. Thus, the blocking switches 420a and 420b remain off, which causes the signal conditioner 103 to remain high impedance.

Next, a transition occurs where the differential signal $D_P$ transitions from HIGH to LOW and the other differential signal $D_M$ transitions from LOW to HIGH. The comparator output signal 205a changes the state from LOW to HIGH and the comparator output signal 205b changes the states from HIGH to LOW. The rising edge of 205a occurs near beginning of the transition and the falling edge of 205b occurs near end of the transition. Between the rising edge of 205a and falling edge of 205b, both comparator output signals are HIGH and thus the transition-indication signal 204 is HIGH. Further, the rising edge of the comparator output signal 205a causes a voltage sag on the gating signal 440a to the pMOS 402a and causes a voltage spike on the gating signal 441b to the nMOS 403b, which turn on the pMOS 402a and nMOS 403b respectively. The gating signal 442, following the signal 204 with a delay, becomes HIGH during the transition, which turns on the two blocking switches 420a and 420b. Thus, a positive current 207 is injected into the differential signal $D_M$ from the power supply $V_{cc}$ through the pMOS 402a and blocking switch 420a, and a negative current 206 returns from the other differential signal $D_P$ and back to ground through the blocking switch 420b and nMOS 403b. The rising edge of $D_M$ and falling edge of $D_P$ are boosted by the positive current 207 and negative current 206, respectively.

Further, it is noted that the length of the time when the signals 204 and 442 are high is adaptive (i.e., inversely proportional) to the edge rates of the differential signals $D_P$ and $D_M$. Lower edge rates of $D_P$ and $D_M$ cause a slower transition and a longer period of time for the signals 204 and 442 to remain HIGH (and thus the two blocking switches 420a and 420b to remain ON). Higher edge rates of $D_P$ and $D_M$ cause a faster transition and a shorter period of time for the signals 204 and 442 to remain HIGH (and thus the two blocking switches 420a and 420b to remain ON). Therefore, the length of time of the current injections during the transition is adaptive (i.e., inversely proportional) to the edge rates of the differential signals $D_P$ and $D_M$.

When the differential signals $D_P$ and $D_M$ get into next steady states where $D_P$ is LOW and $D_M$ is HIGH, the comparator output signal 205a from differential comparator 301a is HIGH, the comparator output signal 205b from differential comparator 301b is LOW, and the transition-indication signal 204 from the AND gate 302 is LOW. The gating signal 442, following the signal 204 with a delay, is LOW as well. Thus, the blocking switches 420a and 420b remain off, which causes the signal conditioner 103 to remain high impedance.

Finally, another transition occurs where the differential signal $D_P$ transitions from LOW to HIGH and the other differential signal $D_M$ transitions from HIGH to LOW. The comparator output signal 205b changes the state with a rising edge near the beginning of the transition, and the comparator output signal 205a changes the state with a falling edge near the end of the transition. Between the rising edge of 205b and falling edge of 205a, both comparator output signals are HIGH and thus the transition-indication signal 204 is HIGH. The rising edge of the comparator output signal 205b causes a voltage sag on the gating signal 440b to the pMOS 402b and causes a voltage spike on the gating signal 441a to the nMOS 403a, which turn on the pMOS 402b and nMOS 403a respectively. Further, the gating signal 442, following the signal 204 with a delay, becomes HIGH during the transition, which turns on the two blocking switches 420a and 420b. Thus, a positive current 206 is injected into the differential signal $D_P$ from the power supply $V_{cc}$ through the pMOS 402b and blocking switch 420b, and a negative current 207 returns from the other differential signal $D_M$ and back to ground through the blocking switch 420a and nMOS 403a. The rising edge of $D_P$ and falling edge of $D_M$ are boosted by the positive current 206 and negative current 207, respectively. Again, the length of time of the current injections during the transition is adaptive (i.e., inversely proportional) to the edge rates of the differential signals $D_P$ and $D_M$.

The differential signals $D_P$ and $D_M$ go through cycles of above steady states and transitions along with the transfer of data packets. The signal conditioner 103 shifts between the high-impedance state and current-injection mode accordingly. When $D_P$ and $D_M$ are in steady states, the signal conditioner 103 remains high impedance. Whenever a transition occurs on the differential signals, the signal conditioner 103 generates appropriate injection currents to boost the edge rates of $D_P$ and $D_M$.

Figure 6:
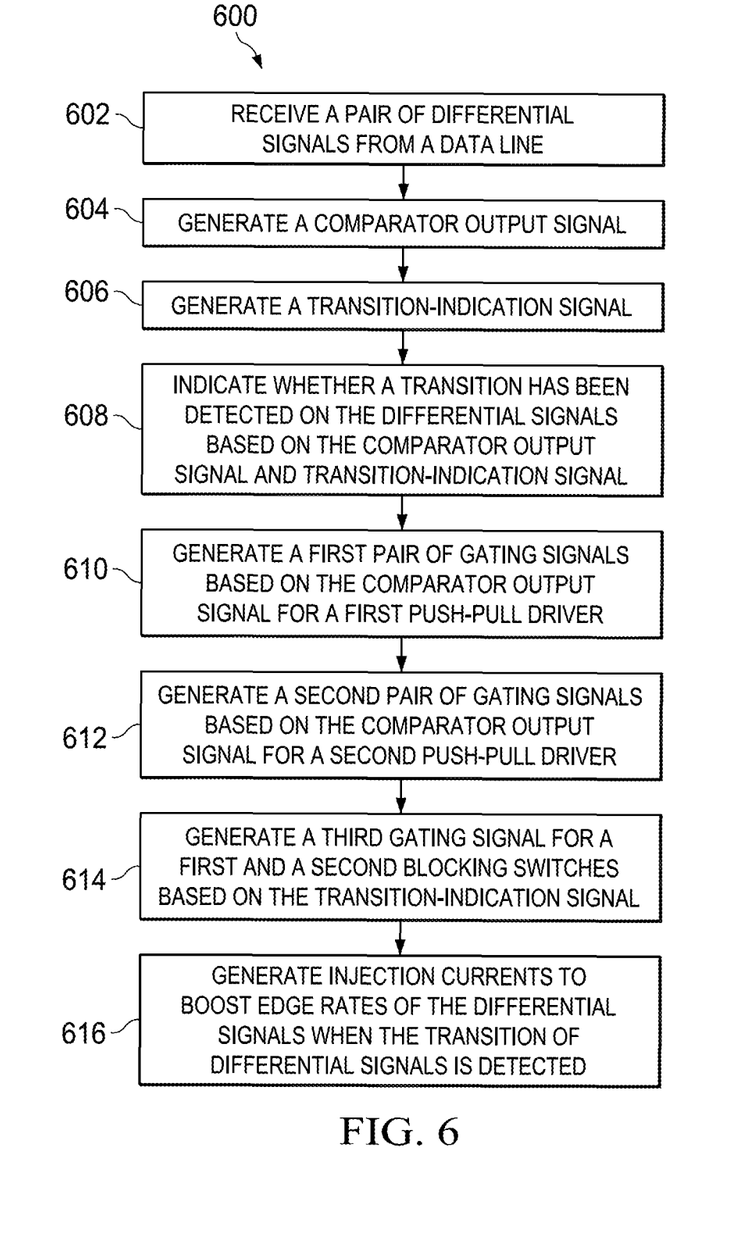
FIG. 6 shows a flow diagram of a method for conditioning signals in accordance with various embodiments.

FIG. 6 shows a flow diagram of a method 600 for conditioning a pair of differential signals $D_P$ and $D_M$ in accordance with various embodiments. Though depicted sequentially as a matter of convenience, at least some of the actions shown can be performed in a different order and/or performed in parallel. Additionally, some embodiments may perform some of the actions shown, or additional actions. In some embodiments, at least some of the operations of the method 600, as well as other operations described herein, can be performed by signal conditioner 103 including transition-detection module 201 and current-injection module 202, and implemented by an integrated circuit (IC) executing instructions stored in a non-transitory computer readable storage medium.

The method begins in block 602 with receiving pair of differential signals $D_P$ and $D_M$ from data lines 104 and 105. In an embodiment, the differential signals $D_P$ and $D_M$ are received by the transition-detection module 201. The transition-detection module 201 may include two differential comparators 301a and 301b coupled in parallel with opposite input polarities, and AND gate 302.

In block 604, the method 600 continues with generating comparator output signal 205. In an embodiment, the differential comparators 301 and 302a are configured to receive the differential signals $D_P$ and $D_M$, and generate the comparator output signals 205a and 205b respectively. The signals 205a and 205b are generated by comparing the difference between the positive input and the negative input to the threshold voltage ($V_{th}$), by the comparators 301 and 302. When the difference between the positive input and the negative input is equal to or higher than $V_{th}$, the comparator output signals 205a and 205b are HIGH. Otherwise, the comparator output signals 205a and 205b are LOW.

In block 606, the method 600 continues with generating transition-indication signal 204. In an embodiment, the AND gate 302 is configured to receive the comparator output signals 205a and 205b and generate the transition-indication signal 204. The transition-indication signal 204 is HIGH when both of the comparator output signals 205a and 205b are HIGH. The transition-indication signal 204 is LOW when one of the comparator output signals 205 and 205b is LOW.

In block 608, the method 600 continues with indicating whether a transition has been detected on the differential signals $D_P$ and $D_M$, based on the comparator output signal 205 and transition-indication signal 204. In one embodiment, when there is a transition of the differential signals $D_P$ and $D_M$, the comparator output signals 205a and 205b will change states accordingly and the transition-indication signal 204 will change to HIGH during the transition. Thus, the state changes of the comparator output signal and the logic high state of the transition-indication signal may serve as a detection of transitions on the differential signals.

In block 610, the method 600 continues with generating a first pair of gating signals 440a and 441a based on the comparator output signal 205 for a first push-pull driver 401a. In one embodiment, the first push-pull driver 401a includes a pMOS 402a in series with an nMOS 403a between a supply voltage $V_{cc}$ and ground. The gating signals 440a to the pMOS 402a is generated based on regulating the comparator output signal 205a by a first inverting buffer 430 and a first AC-coupled pull-up RC network 410. The gating signals 441a to the nMOS 403a is generated based on regulating the comparator output signal 205b by a first buffer 431 and a first AC-coupled pull-down RC network 411.

In block 612, the method 600 continues with generating a second pair of gating signals 440b and 441b based on the comparator output signal 205 for a second push-pull driver 401b. In one embodiment, the second push-pull driver 401b includes a pMOS 402b in series with an nMOS 403b between the supply voltage $V_{cc}$ and ground. The gating signals 440b to the pMOS 402b is generated based on regulating the comparator output signal 205b by a second inverting buffer 430 and a second AC-coupled pull-up RC network 410. The gating signals 441b to the nMOS 403b is generated based on regulating the comparator output signal 205a by a second buffer 431 and a second AC-coupled pull-down RC network 411.

In block 614, the method 600 continues with generating a third gating signal 442 for the first and second blocking switches 420a and 420b. In an embodiment, the third gating signal 442 is generated based on the transition-indication signal 204 with a delay compensation by a third buffer 432.

In block 616, the method of 600 continues with generating injection currents 206 and 207 to boost edge rates of the differential signals $D_P$ and $D_M$ when a transition of the differential signals is detected. In one embodiment, the first blocking switch 420a is coupled to output of the first push-pull driver 401a and generates output 207 that is fed back into the differential signal $D_M$. The second blocking switch 420b is coupled to output of the second push-pull driver 401b and generates output 206 that is fed back into the differential signal $D_P$. When the differential signal $D_P$ transitions from HIGH to LOW and the other differential signal $D_M$ transitions from LOW to HIGH, the third gating signal 442, based on the transition-indication signal 204, causes the first and second blocking switches 420a and 420b to turn on. The comparator output signal 205a transitions with a rising edge, causing a voltage sag on the gating signal 440a to the pMOS 402a and a voltage spike on the gating signal 441b to the nMOS 403b, which turn on the pMOS 402a and nMOS 403b respectively. Thus, a positive current 207 is injected into the differential signal $D_M$ from the power supply $V_{cc}$ through the pMOS 402a and first blocking switch 420a, and a negative current 206 returns from the other differential signal $D_P$ and back to ground through the second blocking switch 420b and nMOS 403b. The rising edge of $D_M$ and falling edge of $D_P$ are boosted by the positive current 207 and negative current 206, respectively. When the differential signal $D_P$ transitions from LOW to HIGH and the other differential signal $D_M$ transitions from HIGH to LOW, the third gating signal 442, based on the transition-indication signal 204, causes the first and second blocking switches 420a and 420b to turn on. The comparator output signal 205b transitions with a rising edge, causing a voltage sag on the gating signal 440b to the pMOS 402b and a voltage spike on the gating signal 441a to the nMOS 403a, which turn on the nMOS 403a and pMOS 402b respectively. Thus, a positive current 206 is injected into the differential signal $D_P$ from the power supply $V_{cc}$ through the pMOS 402b and second blocking switch 420b, and a negative current 207 returns from the other differential signal $D_M$ and back to ground through the first blocking switch 420a and nMOS 403a. The rising edge of $D_P$ and falling edge of $D_M$ are boosted by the positive current 206 and negative current 207, respectively. When the differential signals $D_P$ and $D_M$ are in steady states without a transition, the transition-indication signal 204 is in a logic low state, and thus the two blocking switches 420a and 420b remain off in high impedance with minimum power consumptions.

The signal conditioner and method described herein are direction-agnostic, since they condition data signals by boosting their edge rates through current injections during transitions regardless of which direction the data signals are flowing. Signals may be transferred in both directions over data lines while such a signal conditioner is being employed. For half-duplex or full-duplex data transmission, only one signal conditioner may be needed. The signal conditioner may tap into data lines in a parallel connection without breaking up the data lines. The signal conditioner has relatively high power efficiency since it conditions signals only during transitions and remain high impedance otherwise. The duration of the current injections is adaptive (i.e., inversely proportional) to the edge rates of the differential signals, important to avoid over-shoots in signal conditioning that can causes further signal distortions. Finally, the signal conditioner may work with a variety of data transmission protocols with different signal voltages, by adjusting the threshold voltage of differential comparators of the transition-detection module.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A signal conditioner, comprising:
  a transition-detection module configured to receive a pair of differential signals from a data line and generate a transition-indication signal and a comparator output signal to indicate whether a transition has been detected on the differential signals; and
  a current-injection module configured to receive the transition-indication signal and the comparator output signal from the transition-detection module, generate currents for injection into the data line to boost edge rates of the differential signals when the transition of the differential signals is detected and remain at high impedance when the differential signals have no transition.

2. The signal conditioner of claim 1, wherein the comparator output signal comprises first and second comparator output signals, and wherein the transition-detection module comprises:
  first and second differential comparators coupled with opposite input polarities, the differential comparators configured to receive the differential signals and generate the first and second comparator output signals respectively; and
  an AND gate configured to receive the first and second comparator output signals and generate the transition-indication signal;
  wherein the first and second comparators and the AND gate cause the comparator output signals and the transition-indication signal, respectively, to change state as a result of transitions of the differential signals to indicate whether the transition has been detected on the differential signals.

3. The signal conditioner of claim 2, wherein each of the first and the second differential comparators comprises a differential receiver with an adjustable threshold voltage.

4. The signal conditioner of claim 1, wherein the current-injection module comprises:
  a first push-pull driver configured to receive a first pair of gating signals;
  a second push-pull driver configured to receive a second pair of gating signals;
  a first blocking switch coupled between output of the first push-pull driver and one differential signal, the first blocking switch configured to receive a third gating signal;
  a second blocking switch coupled between output of the second push-pull driver and the other differential signal, the second blocking switch configured to receive the third gating signal;
  wherein the first and second pairs of gating signals are generated based on regulation of the comparator output signal of the transition-detection module;
  wherein the third gating signal is generated based on the transition-indication signal of the transition-detection module;
  wherein the first and second push-pull drivers are configured to generate currents for injection through the first and second blocking switches into the data line to boost edge rates of the differential signals when the transition of the differential signals is detected; and
  wherein the first and second blocking switches remain at high impedance when no transition occurs on the differential signals.

5. The signal conditioner of claim 4, wherein each of the first and second blocking switches comprises an n-channel MOSFET.

6. The signal conditioner of claim 4, wherein each of the first and second push-pull drivers comprises a p-channel MOSFET in series with an n-channel MOSFET between a supply voltage and ground.

7. The signal conditioner of claim 6, wherein the gating signal for the p-channel MOSFET of the first push-pull driver is generated based on regulation of the comparator output signal from the transition-detection module by a first AC-coupled pull-up RC network and a first inverting buffer, and the gating signal for the p-channel MOSFET of the second push-pull driver is generated based on regulation of the comparator output signal from the transition-detection module by a second AC-coupled pull-up RC network and a second inverting buffer.

8. The signal conditioner of claim 6, wherein the gating signal for the n-channel MOSFET of the first push-pull driver is generated based on regulation of the comparator output signal from the transition-detection module by a first AC-coupled pull-down RC network and a first buffer, and the gating signal for the n-channel MOSFET of the second push-pull driver is generated based on regulation of the comparator output signal from the transition-detection module by a second AC-coupled pull-down RC network and a second buffer.

9. The signal conditioner of claim 7, wherein each of the first and second AC-coupled pull-up RC networks comprises:
a capacitor;
a plurality of resistors; and
a plurality of switches;
wherein, for each of the AC-coupled pull-up RC networks, the capacitor is coupled in series with the gate of the p-channel MOSFET of the push-pull driver; and
wherein each of the resistors is in series with and selected by a corresponding one of the switches and, wherein the series combinations of resistors and switches are coupled in parallel between a voltage source and the gate of the p-channel MOSFET of the push-pull driver.

10. The signal conditioner of claim 8, wherein each of the first and second AC-coupled pull-down RC networks comprises:
a capacitor;
a plurality of resistors; and
a plurality of switches;
wherein, for each of the AC-coupled pull-down RC networks, the capacitor is coupled in series with the gate of the n-channel MOSFET of the push-pull driver; and
wherein each of the resistors is in series with and selected by a corresponding one of the switches, and wherein the series combinations of resistors and switches are coupled in parallel between a voltage source and the gate of the n-channel MOSFET of the push-pull driver.

11. The signal conditioner of claim 9, wherein time constants of the first and second AC-coupled pull-up RC networks are configurable through selective control of the plurality of switches.

12. The signal conditioner of claim 10, wherein the time constants of the first and second AC-coupled pull-down RC networks are configurable, respectively, by changing the resistance of the RC network through control of the switches.

13. The signal conditioner of claim 1, wherein the comparator output signal includes first and second comparator output signals, and
wherein the transition-detection module includes:
a plurality of differential comparators coupled with opposite input polarities, the differential comparators are configured to receive the pair of differential signals from the data line and generate the first and second comparator output signals; and
a logic gate configured to conjoin the first and second comparator output signals and generate the transition-indication signal,
wherein the current-injection module includes:
a plurality of push-pull drivers configured to receive gating signals; and
a plurality of blocking switches coupled between the push-pull drivers and at least one of the differential signals;
wherein differential comparators and the logic gate are configured to cause the first and second comparator output signals and the transition-indication signal, respectively, to change states in correspondence to transitions of the differential signals to indicate whether the transition has been detected on the differential signals;
wherein the push-pull drivers are configured to inject the currents into the data line, through the blocking switches, to boost the edge rates of the differential signals based on detection of the transition of the differential signals; and
wherein the blocking switches are configured to remain at high impedance when no transition occurs on the differential signals.

14. The signal conditioner of claim 13,
wherein the push-pull drivers each comprises a p-channel MOSFET in series with an n-channel MOSFET between a supply voltage and ground;
wherein the gating signals for the push-pull drivers are generated based on regulation of the first and second comparator output signals by a plurality of AC-coupled pull-up RC networks and a plurality of AC-coupled pull-down RC networks;
wherein the blocking switches each comprises an n-channel MOSFET; and
wherein the gating signal for the blocking switches is generated based on the transition-indication signal.

15. The signal conditioner of claim 14, the AC-coupled pull-up RC networks each comprises:
a capacitor;
a plurality of resistors; and
a plurality of switches;
wherein the capacitor is coupled in series with the gate of the p-channel MOSFET of the push-pull driver; and
wherein the plurality of resistors, in series with and selected by the plurality of switches, are coupled in parallel between a voltage source and the gate of the p-channel MOSFET of the push-pull driver.

16. The signal conditioner of claim 14, wherein the AC-coupled pull-down RC networks each comprises:
a capacitor;
a plurality of resistors; and
a plurality of switches;
wherein the capacitor is coupled in series with the gate of the n-channel MOSFET of the push-pull driver; and
wherein the plurality of resistors, in series with and selected by the plurality of switches, are coupled in parallel between a voltage source and the gate of the n-channel MOSFET of the push-pull driver.

17. A method, comprising:
generating a comparator output signal and a transition-indication signal to indicate whether a transition has been detected on a pair of differential signals on a data line;
generating a first pair of gating signals for a first push-pull driver, based on regulating the comparator output signal;
generating a second pair of gating signals for a second push-pull driver, based on regulating the comparator output signal;
generating a third gating signal for first and second blocking switches, based on the transition-indication signal, the first blocking switch being coupled between an output of the first push-pull driver and the data line, the second blocking switch being coupled between an output of the second push-pull driver and the data line; and based on detection of the transition of the differential signals, controlling the first and second blocking switches to thereby generate currents for injection into the data line to boost edge rates of the differential signals through the first and second push-pull drivers and the first and second blocking switches.

18. The method in claim 17, further comprising:

receiving the pair of differential signals at inputs of each of first and second differential comparators, the first differential comparator receiving the differential signals in an opposite polarity as is received by the second differential comparator; and logically AND'ing outputs of the first and second differential comparators to generate the transition-indication signal.

19. The method of claim 17, further comprising:

regulating the comparator output signal by a plurality of AC-coupled pull-up RC networks and a plurality of AC-coupled pull-down RC networks to generate the first and second pairs of gating signals for the push-pull drivers.

20. The method of claim 17, further comprising:

generating currents for injection into the data line only during transitions of the differential signals and maintaining the first and second blocking switches in high impedance when no transitions occur on the differential signals.

* * * * *